United States Patent [19]

Ramsden

[11] Patent Number: 5,216,702
[45] Date of Patent: Jun. 1, 1993

[54] NONINTRUSIVE SPEECH LEVEL AND DYNAMIC NOISE MEASUREMENTS

[75] Inventor: David B. Ramsden, Wall, N.J.

[73] Assignee: AT&T Bell Laboratories, Murray Hill, N.J.

[21] Appl. No.: 842,675

[22] Filed: Feb. 27, 1992

[51] Int. Cl.$^5$ .............................................. H04M 3/32
[52] U.S. Cl. ..................................................... 379/24
[58] Field of Search ............... 379/24; 381/46; 375/99

[56] References Cited

U.S. PATENT DOCUMENTS 4,363,938 12/1982 Daaboul et al. ..................... 379/24
4,552,996 11/1985 de Bergh .............................. 379/24

Primary Examiner—Stafford Schreyer
Attorney, Agent, or Firm—F. B. Luludis

[57] ABSTRACT

A digital signal processor is provided with the facility to measure accurately, and nonintrusively, the levels of noise and/or speech signals appearing on an in-service network connection.

21 Claims, 4 Drawing Sheets

NONINTRUSIVE SPEECH LEVEL AND DYNAMIC NOISE MEASUREMENTS

TECHNICAL FIELD

The invention relates to the accurate measurement of speech and noise levels in a transmission path, such as a telephone connection.

BACKGROUND OF THE INVENTION

The levels of noise and speech signals propagating through an in-service transmission path are used to determine the quality of the path. For example, the transmission quality of a path may be questionable if the level of the noise signals is high, or if the level of the speech signals is low (weak). It can be appreciated, therefore, that an accurate determination of the quality of a transmission path requires an accurate measurement of the levels of noise and speech signals as they propagate through the transmission path.

Prior measuring arrangements have been unable to achieve such accuracy, since they do not measure accurately the level of noise signals present in a transmission path. For example, one such prior measuring arrangement performs multiple measurements over respective 30 millisecond windows when noise signals are believed to be present on the transmission path. Noise signals are present when the levels of signals on the path fall below a predetermined threshold. At that point, the prior arrangement measures the levels of all signals that are present on the transmission path within the 30 millisecond window. The arrangement then determines an average noise value for the window. When the prior measuring arrangement has completed a number of such measurements it then outputs, as the noise level of the transmission path, the average having the lowest value.

SUMMARY OF THE INVENTION

I have realized that such a measurement is not accurate since speech signals could be present during a 30 millisecond window and, therefore, would bias the resulting average. I have further realized that the minimum of such averages most likely underestimates the actual noise level of a transmission path.

Accordingly, the art is advanced and the foregoing problems are obviated by providing a facility which obtains a nonintrusive measurement of speech and noise signals present on an in-service connections by determining whether samples of signals received from the connection correspond to speech or noise and then determining the speech and noise levels of the connection as a function of such samples. In this way a dynamic noise measurement is obtained, in accord with an aspect of the invention, by determining the median of a number of measurements of the average power levels of noise signals, in which the measurements are accumulated over respective periods of time when it is known that noise signals are present on the connection. A speech level measurement is obtained in a similar manner.

More specifically, an average power level is determined for succeeding groups of noise signals that are present on the connection within a predetermined period of time. When a predetermined number of such average power levels have been determined, then, in accord with an aspect of the invention, the median of such average power levels is outputted to an output terminal as the noise measurement. Accordingly, an actual average, rather than a minimum, measurement for noise signals is obtained.

DETAILED DESCRIPTION

Figure 1:
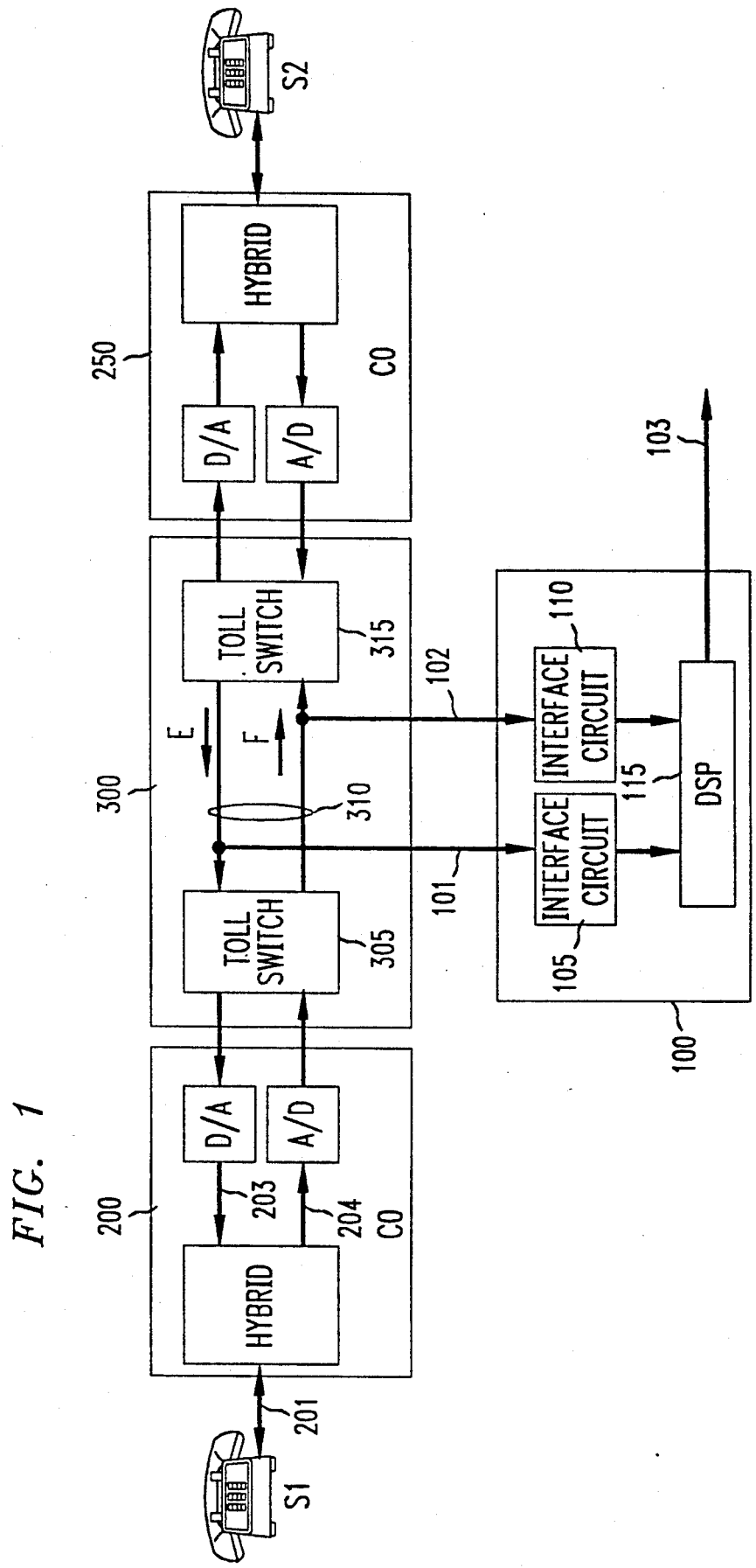
FIG. 1 illustrates the manner in which signal level measuring equipment may be connected to an in-service network connection for the purpose of measuring the level of noise and/or speech signals propagating through the connection.

FIG. 1 illustrates a conventional telephone connection established between station sets S1 and S2 via Central Offices (COs) 200 and 250 and interexchange network 300. The way in which a telephone connection is established between telephone station sets is well-known and will not be discussed herein. However, it is seen from the FIG. that such a connection includes telephone line 201, which connects station set S1 to Central Office (CO) 200. At CO 200, a conventional hybrid arrangement converts 2-wire telephone line 201 to a so-called 4-wire transmission path comprising paths 203 and 204. Paths 203 and 204 are then connected through toll switch 305, intertoll connection 310 and toll switch 315 to CO 250 where another conventional hybrid arrangement converts paths 203 and 204 into a 2-wire telephone line extending to station S2.

As is well-known, interexchange network 300 may be of the type which transports speech signals via its associated intertoll network 310 in digital form. Accordingly, COs 209 and 250 include analog-to-digital and digital-to-analog converters in the interface that they present to network 300.

In order to gauge the quality of the transmission connection between station sets S1 and S2, copies (samples) of the digital speech signals traveling in the E and F directions along intertoll connection 310 are supplied to transmission measurement arrangement 100 via leads 101 and 102, respectively. Digital signals appearing on leads 101 and 102 are then presented to respective inputs of Digital Signal Processor (DSP) 115 via interface circuits 105 and 110, respectively. DSP 115, which may be, for example, the model DSP32 available from AT&T, analyzes the digital samples that it receives from the E and F directions to determine if they represent speech or noise. Specifically, if particular digital samples represent a level which equals or exceeds a predetermined threshold, for example, a threshold having a level of −37 dBm, then DSP 115 operating in accord with the principles of the invention concludes that the samples represent speech signals.

It is well-known that a speaker typically drops the level of his/her voice when completing a response. Accordingly, the level of a speaker's "trailing" voice signals may be below the aforementioned threshold. To account for that situation, DSP 115 is arranged in accord with an aspect of the invention so that when it detects a speech signal that equals or exceeds the threshold it then considers all succeeding samples that occur within a predetermined window—illustratively 200 milliseconds—to be speech signals, even though the levels of those signals may be below the threshold, as will be explained below.

More specially, DSP 115, is arranged to process a number of samples each second, e.g., 8000, for each of the E and F directions. To facilitate such processing, DSP 115, accumulates the values of a group of samples, e.g., 16, as they are received. DSP 115 then determines an average power value for the group. If the average value equals or exceeds the aforementioned threshold of −37 dBm, then DSP 115 considers the average power value and succeeding ones of such values occurring within the aforementioned window to represent speech. As an aspect of the invention, DSP 115 is arranged to accumulate a predetermined number—illustratively 7500—of such average power values for both the E and F directions. When it has concluded such processing, DSP 115 outputs via lead 103 the average value of the 7500 power values it accumulated for the E direction and for the F direction. The outputted averages respectively represent the speech level measurements for the E and F directions.

It can be appreciated that during the measurement speech signals traveling in either the E or F direction could be an echo, which, if included in the speech measurement, could bias the overall speech measurement that DSP 115 outputs to lead 103. To guard against such a possibility, DSP 115 is arranged, in accord with an aspect of the invention, to determine if a group of speech samples that it receives represents an echo. If DSP 115 finds that to be the case, then it discards the group. In particular, if DSP 115 receives simultaneously a group of speech samples from both the E and F directions, then DSP 115 determines if one of the groups represents an echo. If that is the case, then, as mentioned above, DSP 115 discards the average power level determined for that group, as will be explained below.

In addition, if DSP 115 finds that the average power level of a group of samples received from either the E or F direction is below −37 dBm and is not within the aforementioned speech window, then DSP 115 considers the group to be noise. If that is the case, then DSP 115 accumulates (sums) that average power level with the average power levels determined for succeeding groups of samples obtained from the same direction within a 200 millisecond window. However, if any one of such succeeding average power levels equals or exceeds −37 dBm, then DSP 115 discards the accumulation. DSP 115 does so since a power level of −37 dBm most likely represents speech and, therefore, would affect adversely the noise measurement represented by the accumulation, as will be explained below.

Figure 2:
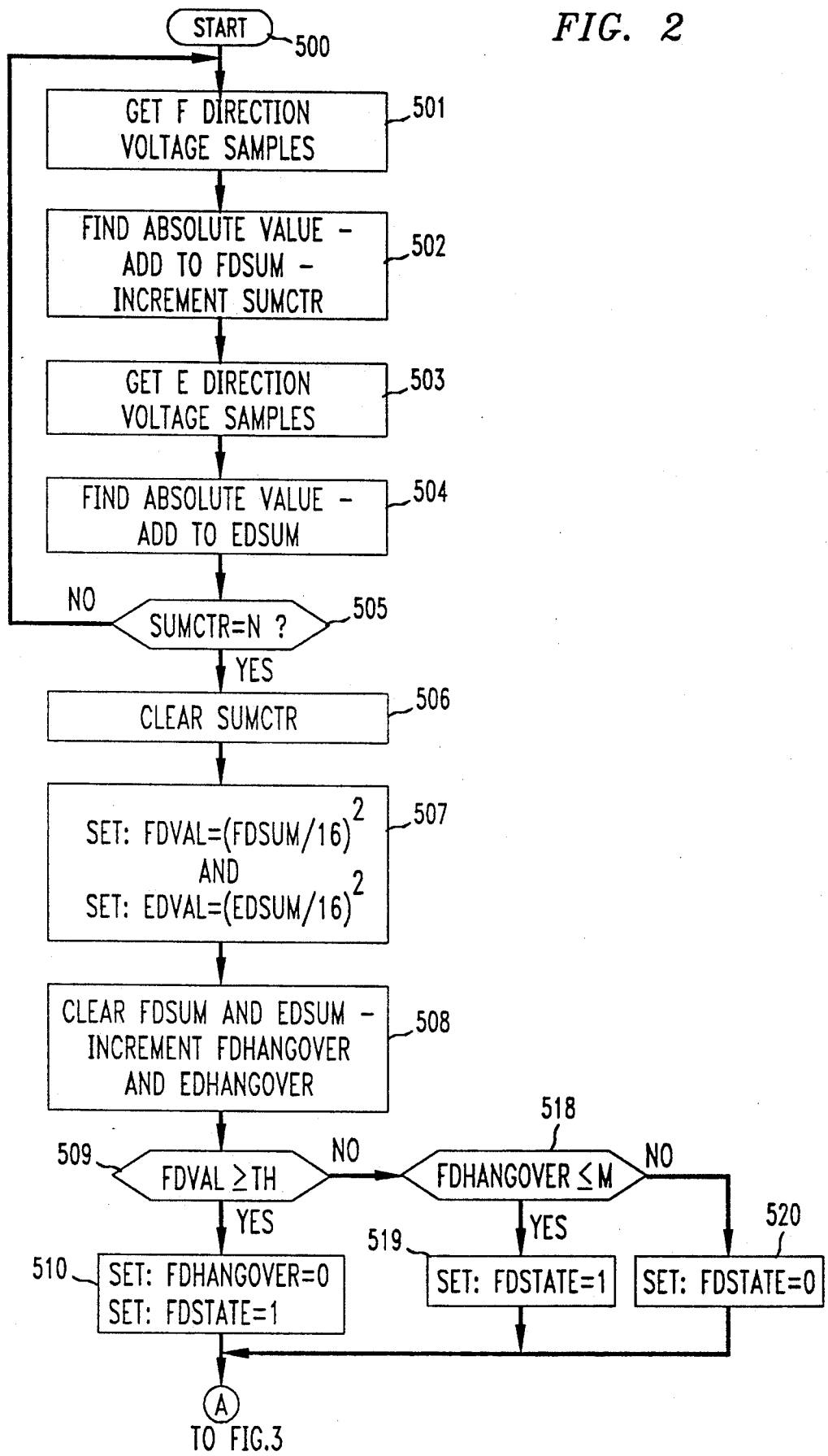
FIGS. 2–4 illustrate in flow chart form the program which implements the invention in the digital signal processor of FIG. 1.
Figure 3:
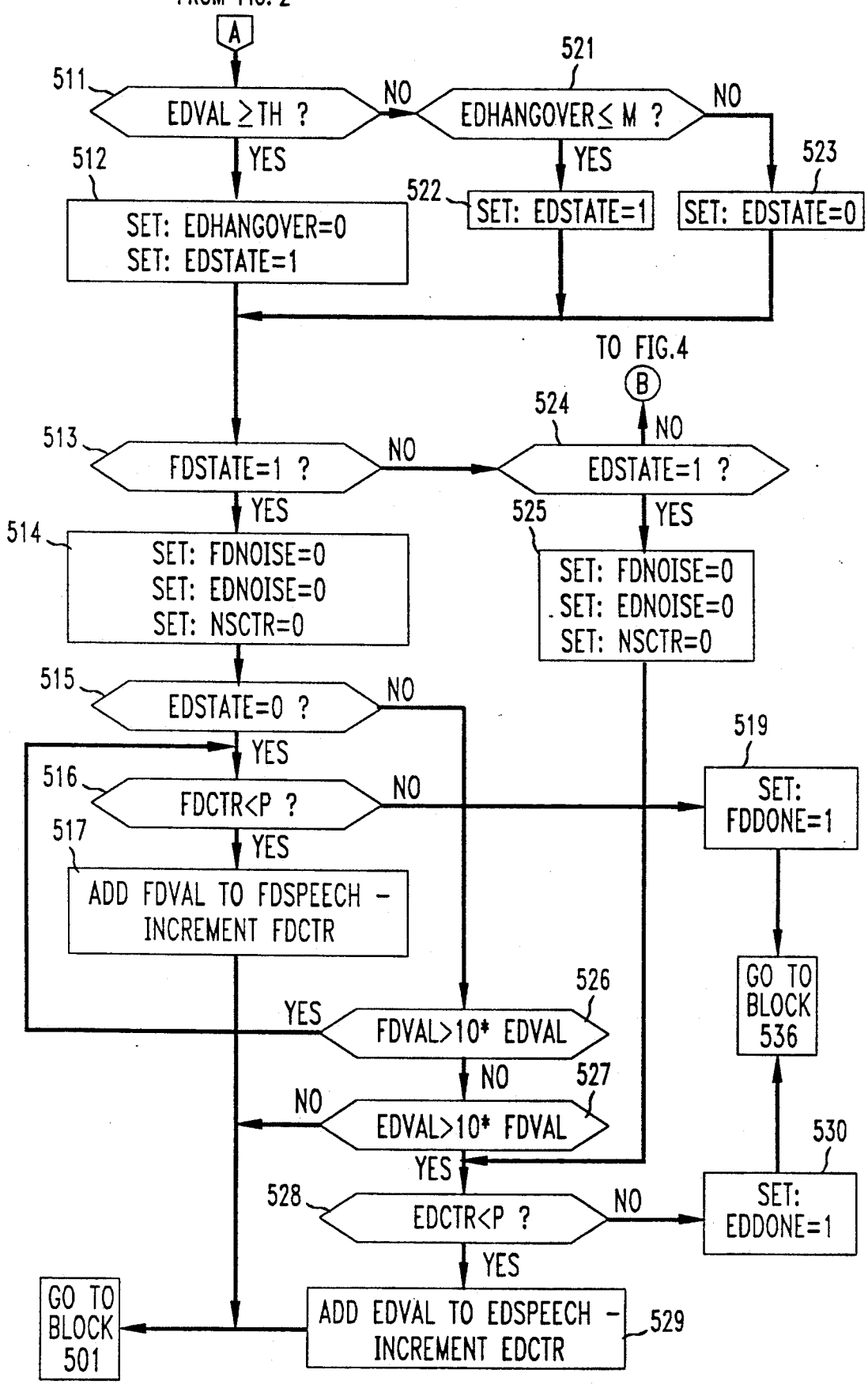
Figure 4:
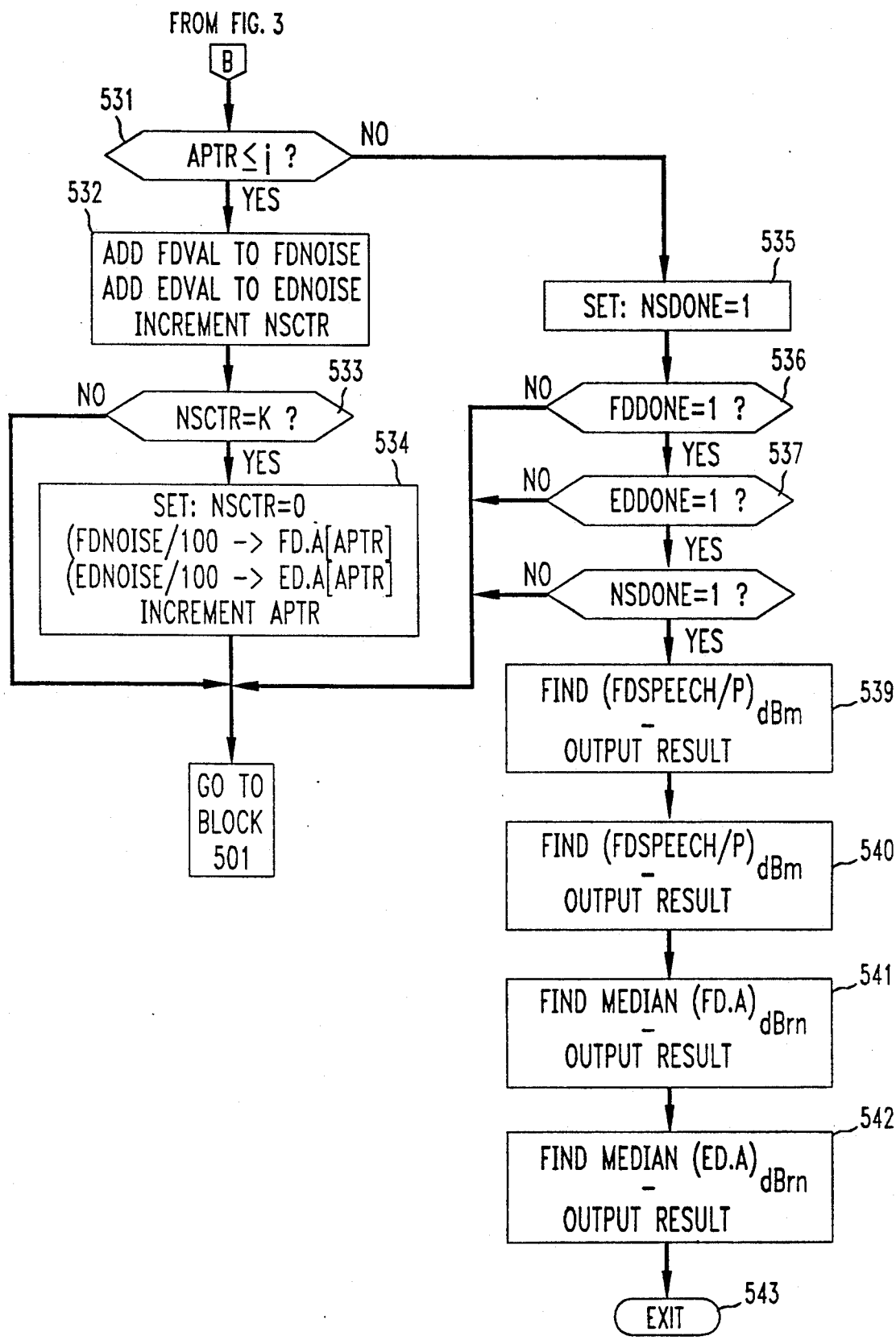

Turning now to FIGS. 2 through 4, there is shown in flow chart form the program which implements the principles of the invention in DSP 100. Specifically, when the program is entered at block 500 it clears a number of flags, counters and accumulators (identified below) and then proceeds to block 501. At block 501, the program accepts a sample of a signal traveling in the F direction over intertoll transmission path 310 (FIG. 1), and then proceeds to block 502. At block 502, the program calculates in a conventional manner the absolute value of the voltage level represented by the received sample. The program then adds the result of the calculation to a running sum (accumulation) designated FDSUM. The program then increments a counter designated SUMCTR by a value of one. The program uses SUMCTR to determine when it has acquired a group of N samples from both the E and F directions, as will be seen below. In an illustrative embodiment of the invention, the value of N may be, for example, 16. Similarly, at blocks 503 and 504, the program acquires a sample of a signal traveling in the E direction and then determines the absolute value of the voltage level of that sample. The program then adds the latter result to a running sum designated EDSUM. The program then proceeds to block 505.

At block 505, the program returns to block 501 if the value contained in SUMCTR indicates that it has not acquired N samples (e.g., 16 samples) for each of the two oppositely directed transmission paths. Otherwise, the program proceeds to block 506 where it clears (sets to zero) the contents of SUMCTR and then proceeds to block 507. At block 507, the program squares the average voltage level represented by FDSUM/16 (EDSUM/16) to obtain a value designated FDVAL (EDVAL), which is proportional to the average power level of the group of samples acquired from the F (E) direction. The program then proceeds to block 508 where it clears FDSUM and EDSUM and increments two counters respectively designated FDHANGOVER and EDHANGOVER by a value of one. The program then proceeds to block 509. (The purpose of the latter counters will be made clear below. However, it suffices to say at this point that those counters represents a particular period of time which is defined herein as being a "hangover" time.)

Program blocks 509, 510 and 518 through 520 represent a program module which determines if the value of FDVAL determined at block 507 represents speech. Program blocks 511, 512 and 521 through 523 perform a similar function on EDVAL.

Specifically, at block 509, the program compares the value FDVAL with a threshold (TH) having a predetermined value—illustratively −37dBm. If the program finds that the value of FDVAL equals or exceeds the value of TH, then it proceeds to block 510. Otherwise, the program proceeds to block 518. At block 510, the program sets the contents of counter FDHANGOVER to zero and sets a flag FDSTATE to equal a value of one to indicate that the value of FDVAL represents speech. The program then proceeds to block 511.

As an aspect of the invention, the program classifies as speech signals, samples of signals acquired within 200 milliseconds of a group of samples whose power value, e.g., FDVAL, exceeds TH. Accordingly, the program uses a "hangover" time to include samples of weak speech signals which follow, within 200 milliseconds, a strong speech signal. The program implements the foregoing by incrementing hangover counter FDHANGOVER by a value of one each time it passes through block 508, in which, in accord with the aforementioned sampling rate, a value of one represents two milliseconds. In addition, the program clears counter FDHANGOVER at block 510 to ensure that the F-direction samples that are acquired within the next 200 milliseconds are classified as speech signals.

In particular, when the program arrives at block 518, it compares the value represented by the contents of counter FDHANGOVER with a predetermined value M, e.g., 100, representing 200 milliseconds. The program proceeds to block 519 if the comparison indicates that the former value is less than the latter value, otherwise, the program proceeds to block 520. At block 519, the program sets flag FDSTATE to a value of one to indicate that the current value of FDVAL represents speech. At block 520, the program sets the value of FDSTATE to zero to indicate that the value of FDVAL does not represent speech, since that value is below TH and was derived from samples that were received after the expiration of the hangover time. The program then proceeds to block 511 (FIG. 3).

As mentioned above, blocks 511, 512 and 521 through 523 perform a similar function with respect to EDVAL. As such, when the program arrives at block 513, the value of flag EDSTATE will be set to a one or zero, indicating that the value of EDVAL represents speech or nonspeech (noise) signals, respectively.

Blocks 513, 514 and 524 represent a program module which determines if (a) speech signals were detected in one direction only, E or F, or both directions, or (b) nonspeech signals were detected in both the E and F directions. If speech is detected in both directions, then the program (blocks 526 and 527) determines, in accord with an aspect of the invention, if either the E- or F-direction speech is an echo. If that is the case, then the program retains the power level derived from the true speech samples and discards the power level derived from the echo. The program discards the latter power level, since it represents a reflection of true speech signals. If the module determines that EDVAL and FDVAL both represent speech then the module nevertheless discards those values, since the level of speech signals represented by one of those values could have been "boosted" by an echo, thereby making the level of such signals somewhat higher than the actual level of speech signals.

Specifically, the program at block 513 proceeds to block 514 if it finds that FDSTATE is set to a value of one, which, as mentioned above, is indicative of speech. Otherwise, the program proceeds to block 524 where it proceeds to block 531 if it finds that EDSTATE is set to a value of zero, which, as mentioned above, is indicative of nonspeech signals (i.e., noise). Otherwise, the program proceeds to block 525.

At block 514 (525), the program clears two values, EDNOISE and FDNOISE, which it uses to accumulate the power level value determined for each of a number of successive groups of samples that are found to represent noise and obtained from the E direction and/or F direction, respectively. The program also clears a counter, NSCTR, that it uses to track the number of successive groups of E- and F-direction samples that are found to be noise. The purpose of the EDNOISE and FDNOISE values and NSCTR counter will be made clear below. Following the foregoing, the program then proceeds to block 515.

At block 515, the program proceeds to block 526 if it finds that EDSTATE is also set to a value of one. Otherwise, the program proceeds to block 516.

At block 516 (528) the program determines whether or not it has processed a predetermined number—illustratively 7500—groups of F-direction (E-direction) speech samples. To make that determination, the program maintains a counter, FDCTR (EDCTR), which it increments following the processing of a group of F-direction (E-direction) speech samples. If the program finds that the value of FDCTR (EDCTR) equals or exceeds a value of 7500 (noted in the FIG. as P) then it proceeds to block 519 (530). Otherwise, the program proceeds to block 517 (529). At block 519 (530), the program sets a flag designated FDDONE (EDDONE) to indicate that it has processed 7500 groups of F-direction (E-direction) speech samples. The program then proceeds to block 536. At block 517 (529), the program adds the value of FDVAL (EDVAL) (i.e., the power level that the program derived from the current group of samples obtained from the F (E) direction) to an accumulation, FDSPEECH (EDSPEECH), of such power levels. The program then increments counter FDCTR (EDCTR) by a value of one and then returns to block 501 to repeat the foregoing process.

At block 526, the program checks to see if FDVAL is at least 10 dB greater than EDVAL. If that is the case, then the program concludes that FDVAL represent speech and that EDVAL possibly represents an echo. As such, the program proceeds to block 516 to process FDVAL. In doing so, the program discards EDVAL. If that is not the case, then the program proceeds to block 527. At block 527, the program checks to see if EDVAL is at least 10 dB greater than FDVAL. If the program finds that to be the case, then it proceeds to block 528 to process EDVAL and discard FDVAL. Otherwise, the program concludes that both EDVAL and FDVAL represent speech and, therefore, discards those values and returns to block 501.

At block 531 the program determines if the value of a pointer, APTR, which is used to index a first and second array, is less than a predetermined value i, for example, a value of 20. The first array (FD.A) is used to store the average value of 100 FDVALs derived from 100 consecutive groups of F-direction noise samples. Similarly, the second array (ED.A) is used to store the average value of 100 EDVALs derived from 100 consecutive groups of E-direction noise samples. The program uses the aforementioned NSCTR counter to track 100 consecutive FDVALs and EDVALs that represent noise power levels, in which an NSCTR value of 100 represents approximately 200 milliseconds. In this way, the program stores the average power level of consecutive samples obtained within a 200 millisecond window from both the E and F transmission paths in respective ED.A and FD.A array locations.

In particular, if the program finds that the value of APTR is less than 20 then it proceeds to block 532. Otherwise, it proceeds to block 535 as a result of having filled each location forming the ED.A and FD.A arrays. At block 532, the program (a) adds the values of FDVAL and EDVAL (which represent noise) to accumulators FDNOISE and EDNOISE, respectively, and (b) increments counter NSCTR by a value of one. The program then proceeds to block 533 where checks to see if the value of NSCTR equals 100. If that is the case, then the program proceeds to block 534. Otherwise, it returns to block 501. At block 534, the program sets counter NSCTR to zero. The program then determines the average value contained in accumulators FDNOISE and EDNOISE and stores the results in their respective arrays, FD.A and ED.A, at a location determined by the current value of pointer APTR. The program then (a) clears accumulators FDNOISE and EDNOISE, (b) increments pointer APTR by a value of one and then (c) returns to block 501.

At block 535, the program sets a flag, NSDONE to indicate that it has accumulated sufficient data to calculate an accurate noise level measurement for the E and F transmission paths. At blocks 536 through 538, the program determines if it has accumulated the required data to generate speech and noise measurements for both the E and F transmission paths and proceeds to block 539 if it finds that to be the case. Otherwise, the program returns to block 501 via one of the NO branches of blocks 536 through 538.

The program arrives at block 539 as a result of having accumulated in each accumulator FDSPEECH and EDSPEECH the average power values for 7500 groups of respective speech samples and has stored in each of the arrays FD.A and ED.A twenty average power values relating to noise samples. As mentioned above, each of the latter power values represents the average power contained in a 200 millisecond window of noise signal samples. More particularly, the program at block 539 determines the average power level for the aforementioned 7500 (i.e., P) groups obtained from the F direction path. The program makes that determination by dividing the contents of accumulator FDSPEECH by 7500. The program then converts the resulting value to dBm and outputs that result to lead 103 (FIG. 1) as the speech measurement for the F direction. The program then proceeds to block 540 where it similarly generates a speech measurement for E direction and outputs that result to lead 103. The program then proceeds to block 541 where it determines in a conventional manner the median of the twenty values stored in array FD.A. The program converts that median value to dBrn and outputs that result to lead 103 as the noise measurement for the F direction. The program then proceeds to block 542 where it determines in a similar manner the noise measurement for the E direction and then outputs that result to lead 103. The program then exits via block 543.

The foregoing is merely illustrative of the principles of the invention. Those skilled in the art will be able to devise numerous arrangements, which, although not explicitly shown or described herein, nevertheless embody those principles that are within the spirit and scope of the invention.

I claim:

1. Apparatus for measuring the level of noise signals when they are present on a transmission path comprising means for determining individual average power levels for respective succeeding groups of said noise signals present within a predetermined period of time on said path and for determining an average power level for said groups as a function of said individual average power levels, means for storing in a memory the average power level for said groups as well as average power levels determined for respective other ones of said groups, and means, operative when a predetermined number of such average power levels have been stored in said memory, for outputting as the noise level of said transmission path the median value of said stored average power levels.

2. The apparatus set forth in claim 1 wherein said means for determining includes means, operative in the event that a current one of said individual average power levels is indicative of speech signals, for then discarding those of said individual average power levels determined prior to said current one of said individual ones of said power levels.

3. The apparatus set forth in claim 1 wherein said means for determining includes means for determining individual average power levels for respective groups of speech signals when they are present on said transmission path, and means operative when a predetermined number of said individual average speech power levels have been determined for outputting to an output terminal the average value of said number of average speech power levels as the level of speech on said transmission path.

4. The apparatus set forth in claim 3 wherein said means for determining further includes means for classifying a signal present on said transmission path as a speech signal if the level of the signal at least equals a predetermined threshold, and means responsive to a signal being classified as a speech signal for classifying a predetermined number of succeeding signals present on said transmission path as speech signals even though the levels of those signals are below said predetermined threshold and for including such speech signals in respective ones of said groups of speech signals.

5. The apparatus set forth in claim 3 wherein said transmission path comprises two oppositely directed transmission paths, and wherein said means for determining includes means for determining average power levels for respective groups of signals when they are present on respective ones of said oppositely directed transmission paths.

6. The apparatus set forth in claim 5 wherein said means for determining further includes means, operative when ones of said groups of signals are present simultaneously on respective ones of said oppositely directed transmission paths, for discarding the average power levels determined for those of said ones of said groups of signals that represent an echo.

7. The apparatus set forth in claim 6 wherein said means for discarding includes means for discarding those of said ones of said groups of signals that represent speech.

8. Apparatus for measuring the level of noise signals on an in-service transmission path comprising means for receiving the levels of respective ones of said noise signals as they appear in succession within a predetermined period of time on said transmission path, means for forming said levels into respective groups of levels as said levels are received and for generating an average power level for each of said groups, means for accumulating each said average power level that is generated within a predetermined period of time and for generating an average power level for said accumulation, and means, operative when a predetermined number of average power levels have been generated for a like number of such accumulations, for outputting to an output terminal a value representing the median of said predetermined number of average power levels.

9. The apparatus set forth in claim 8 wherein said means for forming and generating includes means, operative in the event that the average power level generated for a current one of said groups is indicative of speech signals, for discarding the average power level generated for those of said groups that were received prior to said current one of said groups.

10. The apparatus set forth in claim 8 wherein said means for forming and generating includes means for generating individual average power levels for respective groups of speech signals that are present on said transmission path, and means operative when a predetermined number of said average speech power levels have been generated for outputting a power level indicative of the level of speech signals on said transmission path, in which said power level is generated as a function of the average power levels generated for said groups of speech signals.

11. The apparatus set forth in claim 10 wherein said means for forming and generating further includes means for classifying a signal present on said transmission path as a speech signal if the level of that signal at least equals a predetermined threshold, and means responsive to a signal being classified as a speech signal for then classifying a predetermined number of succeeding signals present on said transmission path as speech signals even though the levels of those signals are below said predetermined threshold and for including such speech signals in respective ones of said groups of speech signals.

12. The apparatus set forth in claim 10 wherein said transmission path comprises two oppositely directed transmission paths, and wherein said means for forming includes means for determining average power levels for respective groups of signals when they are present on respective ones of said oppositely directed transmission paths.

13. The apparatus set forth in claim 12 wherein said means for determining further includes means, operative when ones of said groups of signals are present simultaneously on respective ones of said oppositely directed transmission paths, for discarding the average power levels determined for those of said ones of said groups of signals that represent an echo.

14. The apparatus set forth in claim 13 wherein said means for discarding includes means for discarding those of said ones of said groups of signals that represent speech.

15. Apparatus for measuring the level of noise signals when they are present on a transmission path comprising means for accumulating the levels of said noise signals for each of a succession of windows, each of said windows representing a predetermined period of time, means, responsive to the presence of a speech signal on said transmission path during a current one of said windows, for discarding the associated accumulation, and means for generating a value as a function of the accumulation obtained for each of said windows and for outputting said value to an output terminal as the level of noise signals present on said transmission path.

16. The apparatus set forth in claim 15 wherein said means for discarding includes means for classifying a signal present on said transmission path as a speech signal if the level of the signal at least equals a predetermined threshold, and means, responsive to a signal being classified as a speech signal, for classifying a predetermined number of succeeding signals present on said transmission path as speech signals even through the levels of those signals are below said predetermined threshold.

17. The apparatus set forth in claim 16 wherein said transmission path comprises two oppositely directed transmission paths, and wherein said means for accumulating includes means for accumulating the levels of signals when they are present on respective ones of said oppositely directed transmission paths.

18. The apparatus set forth in claim 17 wherein said means for discarding includes means, operative when ones of said signals are present simultaneously on respective ones of said oppositely directed transmission paths, for discarding the accumulation determined for those signals that represent an echo.

19. The apparatus set forth in claim 18 wherein said means for discarding includes means for discarding the accumulation for those of said simultaneous signals that represent speech.

20. A method of for measuring the level of noise signals when they are present on a transmission path comprising accumulating the levels of said noise signals for each of a succession of windows, each of said windows representing a predetermined period of time, responding to the presence of a speech signal on said transmission path during a current one of said windows by discarding the associated accumulation, and generating a value as a function of the accumulation obtained for each of said windows and then outputting said value to an output terminal as the level of noise signals present on said transmission path.

21. A method for measuring the level of noise signals when they are present on a transmission path, said method comprising the steps of determining individual average power levels for respective succeeding groups of said noise signals occurring within a predetermined period of time and determining an average power level for said groups as a function of said individual average power levels, storing in a memory the average power level for said groups as well as average power levels determined for respective other ones of said groups, and when a predetermined number of such average power levels have been stored in said memory, then outputting as the noise level of said transmission path the median value of said stored average power levels.

* * * * *